Feb. 24, 1959 D. Q. FULLER 2,875,385
TRANSISTORS
Filed Feb. 14, 1955
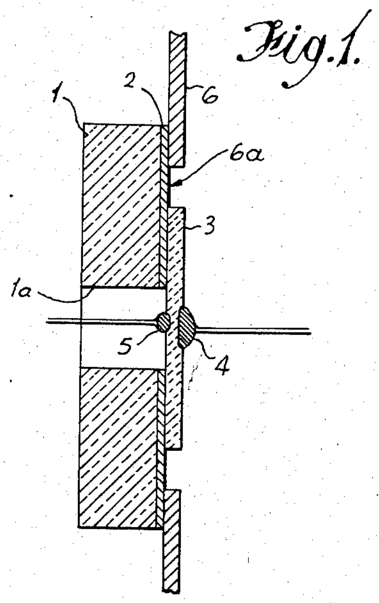
Fig. 1, Fig. 2
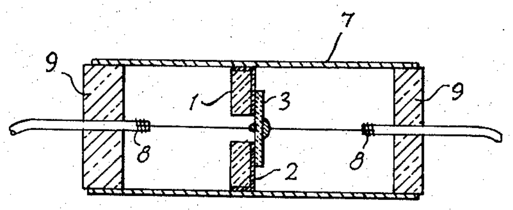
*Inventor*
DENNIS Q FULLER
By Holcombe Wetherill & Brisebois
*Attorneys*

2,875,385
Patented Feb. 24, 1959

2,875,385

TRANSISTORS

Dennis Quintrell Fuller, Cambridge, England, assignor to Pye Limited, Cambridge, England, a British company Application February 14, 1955, Serial No. 487,831

Claims priority, application Great Britain February 18, 1954

6 Claims. (Cl. 317—235)

The present invention relates to transistors and to an improved method of manufacturing transistors, particularly junction transistors.

It is well known that the three major factors adversely affecting the operation of transistors at high frequencies are:

(*a*) The necessity for charge currents to flow by diffusion from the base connection to the emitter-collector region. Because of the distance between the base connection and the emitter-collector region, and the slow diffusion rates, this charging effect acts as a high input capacity.

(*b*) The resistance of the semi-conductor material, such as germanium constituting the portion between the base connection and the emitter-collector region acts as a series input resistance with consequent attenuation and feedback difficulties.

(*c*) The fact that current flows from the emitter to collector by diffusion also renders the spacing between emitter and collector important, since if this is large the random flow of individual current carriers gives rise to a dispersion effect, limiting the gain of the unit and also with a large spacing path lengths from emitter to collector may differ, thus enhancing the dispersion effect.

Thus it can be seen that to improve the operation at high frequencies factor (*c*) requires a thinner base wafer of semi-conductor material this in turn adversely affects factor (*b*), in that it increases the base resistance. Another disadvantage of the thinner wafer is fragility, since the required thickness may be .0005" to .002".

The limitation of power dissipation is primarily a question of removing heat from the emitter-collector region, and thus the reduction in thickness of the base wafer adversely affects this as well, since a fair proportion of heat loss is via the base wafer to the base connection.

It is an object of the present invention to provide a method of manufacturing transistors which makes it possible to use very thin material semi-conductor material with a reduced risk of breakage, and to provide a transistor having a low resistance between the base connection and emitter-collector region with a rapid heat transfer away from this region. A further object of the invention is to provide a transistor, particularly a junction transistor, suitable for operation at high frequencies and at higher power dissipations than are at present obtainable.

According to one aspect of the invention, a wafer of semi-conductor material is mounted on a support having an electrically-conducting surface in contact with the wafer, said surface forming the base connection to the transistor and extending round the emitter and/or collector electrodes which are also connected to the wafer. The support comprises an apertured member which can be made either of insulating material having a conducting coating on one side, or made of metal. The semi-conducting wafer is affixed to a conducting surface of the apertured supporting member so that it extends across the hole therein and the emitter and collector are secured to the portion of the wafer extending over the hole, so that the conducting surface of the supporting member forms a base electrode extending entirely around the emitter and collector. Generally the emitter and collector are respectively connected to opposite sides of the wafer.

With such a construction the base electrode serves as a mount during processing, thus enabling a relatively thick semi-conductor wafer to be affixed to the base electrode which wafer can subsequently be lapped or ground down to a very thin plate with a greatly reduced risk of breakage. When the wafer has reached the desired thinness, the emitter and collector electrodes can be affixed thereto in a normal manner.

From another aspect therefore, the invention provides a method of manufacturing a transistor comprising the steps of securing a substantially thick semi-conductor wafer to an electrically-conducting surface of an apertured supporting member grinding or otherwise reducing the wafer to the desired thinness and securing or depositing emitter and collector electrodes to that portion of the wafer extending over the hole in the supporting member.

According to a feature of the invention, the periphery of the supporting member may be secured to the internal walls of a metal tube forming a casing for the completed transistor, electrical connections to the emitter and collector being brought out through insulating plugs in the ends of the tube. The conducting coating on the supporting member, or the member itself if made of metal, is electrically connected to the metal tube which forms the base connection to the transistor and also assists in conducting heat away from the base region.

In order that the invention may be more clearly understood, reference will now be made to the accompanying drawings, in which:

Fig. 1 shows a diagrammatic cross-sectional view, greatly magnified, of one form of junction transistor constructed according to the invention, and Fig. 2 shows a method of mounting a transistor constructed according to the invention in a casing.

Referring to Fig. 1, an apertured supporting member 1, preferably of circular form which may be made from an insulating material such as a ceramic material, having a tin or other metallic deposit 2, on one side thereof, serves as a support to which is soldered or otherwise affixed a wafer 3 of semi-conductor material such as germanium so that it is in electrical contact with the deposit 2, and extends across the hole 1*a* in the member 1. Alternatively, a metal supporting member may be used. The supporting member 1 serves as a mount during processing, thus enabling a relatively thick semi-condutor wafer 3 (of the order of .005" to .01") to be attached thereto, and the wafer can subsequently be lapped or ground down to a very thin plate (which may be of the order of .0005" to .002") with a greatly reduced risk of breakage. The wafer 3 may be of any convenient shape for example rectangular. When the wafer has reached the desired thinness the emitter 4 and collector 5 which may be of indium are alloyed into position, thus producing a diffused junction transistor.

The circumferential base connection to the wafer, formed by the conducting metallic deposit 2, reduces the base resistance and effective input capacity and also makes the heat path away from the active region as short as possible in all directions. If desired, the heat transfer can be facilitated further by mounting the unit thus formed on an apertured metal plate 6 by soldering or otherwise fixing the outer portion of the conducting surface of the member 1 to the edge of the aperture 6*a* in the metal plate.

Fig. 2 shows a convenient arrangement for mounting the transistor unit shown in Fig. 1 in which the member 1 is an apertured disc or washer of circular form and is mounted in a cylindrical metal outer casing 7 with the periphery of the member 1 if metal, or the metallic deposit on the member if an insulating member, in electrical contact with the internal wall of the metal casing. Thus the tubular metal casing assists in the dissipation of heat away from the transistor and also provides the means for making an electrical connection to the base. Connection wires 8 to the emitter and collector are brought out through plugs 9 of the insulating material in the ends of the tubular casing.

Whilst particular embodiments have been described it will be understood that various modifications may be made without departing from the scope of this invention. For example, the apertured supporting member 1 and the aperture therein can be of any shape in which case the outer casing is made of appropriate cross-section. If desired the collector and emitter may be arranged on the same side of the wafer.

The invention may also be applied to grown junction transistors or point-contact transistors.

I claim:

1. A method of manufacturing a transistor, comprising the steps of depositing an electrically-conducting metallic layer on an apertured supporting member of insulating material, securing a wafer of semi-conductor material to the electrically-conducting surface of said supporting member such that said wafer is supported securely by said member to permit and withstand a thickness reducing operation thereon, and so that an electrical connection is made between said wafer and said conducting surface and a portion of said wafer extends over said aperture in the supporting member, reducing that surface of the wafer opposite to the supporting member until the wafer is of the desired thinness, and securing emitter and collector electrodes to spaced points on that portion of said wafer extending over said aperture.

2. A method of manufacturing a transistor, comprising the steps of securing a wafer of semi-conductor material to an electrically-conducting coating deposited on an apertured supporting disc of insulating material such that said wafer is supported securely by said disc to permit and withstand a grinding operation thereon, and so that an electrical connection is made between said wafer and said conducting coating and a portion of said wafer extends over said aperture in said supporting disc grinding the surface of the wafer to the desired thinness and depositing emitter and collector connections at spaced points on to that portion of said wafer extending over said aperture.

3. A method of manufacturing a transistor comprising the steps of securing a wafer of semi-conductor material to an electrically-conducting surface of an apertured supporting member of insulating material such that said wafer is supported securely by said member to permit and withstand an operation for reducing the thickness of said wafer whilst it is supported by said member and so that an electrical connection is made between said wafer and said conducting surface and a portion of said wafer extends over said aperture in said supporting member, reducing the wafer of semi-conductor material to the desired thinness, and securing emitter and collector electrodes at spaced points on that portion of said wafer extending over said aperture.

4. A method of manufacturing a transistor comprising the steps of securing a wafer of semi-conductor material to an electrically-conducting surface of an apertured disc of insulating material such that said wafer is supported securely by said disc to permit and withstand an operation for reducing the thickness of said wafer whilst it is supported by said disc and so that an electrical connection is made between said wafer and said conducting surface and a portion of said wafer extends across said aperture in said disc, reducing the wafer of semi-conductor material to the desired thinness within a range of the order of .0005 inch to .002 inch, and securing emitter and collector electrodes at spaced points on that portion of said wafer extending across said aperture.

5. A transistor comprising an aperture disc of insulating material having a surface coated with an electrically-conducting material, a wafer of semi-conductor material secured and electrically connected to the conducting surface of said disc with a portion of the wafer extending across the aperture in the disc, said wafer of semiconductor material being substantially smaller than and several times thinner than the disc, an emitter electrode and a collector electrode respectively secured on opposite sides of said wafer on the portion of said wafer extending across said aperture, a heat dissipating metallic member surrounding the periphery of said disc and connected to said electrically-conducting surface and electrical connections to the emitter electrode and to the collector electrode.

6. A transistor comprising an apertured supporting member of insulating material having a surface coated with an electrically-conducting material, a wafer of semiconductor material secured and electrically connected to the conducting surface of said member with a portion of the wafer extending over the aperture in the supporting member, said wafer of semi-conductor material being substantially smaller than and several times thinner than the supporting member, an emitter electrode and a collector electrode respectively secured at spaced points on said portion of said wafer extending over said aperture, a heat-dissipating metallic member surrounding the periphery of said supporting member and connected to said electrically-conducting surface, and electrical connections to the emitter electrode and to the collector electrode.

References Cited in the file of this patent

UNITED STATES PATENTS

| | | |
|---|---|---|
| 2,644,914 | Kircher | July 7, 1953 |
| 2,646,536 | Benzer et al. | July 21, 1953 |
| 2,691,750 | Shive | Oct. 12, 1954 |
| 2,754,455 | Pankove | July 10, 1956 |
| 2,765,516 | Haegele | Oct. 9, 1956 |
| 2,825,014 | Willemse | Feb. 25, 1958 |

FOREIGN PATENTS

| | | |
|---|---|---|
| 1,080,034 | France | May 26, 1954 |